(12) United States Patent
Chen et al.

(10) Patent No.: US 8,913,442 B2
(45) Date of Patent: Dec. 16, 2014

(54) CIRCUIT FOR SENSING MLC FLASH MEMORY

(71) Applicant: Elite Semiconductor Memory Technology Inc., Hsinchu (TW)

(72) Inventors: Chung Zen Chen, Hsinchu (TW); Yi Shin Huang, Taoyuan County (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 83 days.

(21) Appl. No.: 13/725,648

(22) Filed: Dec. 21, 2012

(65) Prior Publication Data

US 2014/0177334 A1     Jun. 26, 2014

(51) Int. Cl.
    *G11C 16/00*     (2006.01)
    *G11C 16/26*     (2006.01)
    *G11C 11/56*     (2006.01)

(52) U.S. Cl.
    CPC ............ *G11C 16/26* (2013.01); *G11C 11/5642* (2013.01)
    USPC .................................................... 365/189.07

(58) Field of Classification Search
    CPC ...................................................... G11C 16/28
    USPC .................................................... 365/189.07
    See application file for complete search history.

(56) References Cited

U.S. PATENT DOCUMENTS

| | | | |
|---|---|---|---|
| 6,069,830 A | 5/2000 | Seo | |
| 6,717,848 B2 | 4/2004 | Kim et al. | |
| 2004/0190327 A1* | 9/2004 | Baker | 365/148 |
| 2006/0126389 A1* | 6/2006 | Sarig | 365/185.21 |
| 2007/0127289 A1* | 6/2007 | Lee | 365/182 |
| 2013/0297986 A1* | 11/2013 | Cohen | 714/763 |

* cited by examiner

*Primary Examiner* — Hoai V Ho
*Assistant Examiner* — Min Huang
(74) *Attorney, Agent, or Firm* — WPAT, P.C.; Anthony King; Kay Yang (57) ABSTRACT

A circuit for sensing a multi-level cell (MLC) flash memory is disclosed. The circuit comprises a plurality of first decoding units, a second decoding unit and a data latch. Each of the first decoding units provides a timing information and includes a controlled transistor to allow a current to pass therethrough, and a capacitor to be charged by the current or to discharge through the controlled transistor. The second decoding unit provides a latch signal and includes a controlled transistor to allow a current to pass therethrough, the magnitude of the current being associated with data in an MLC, and a capacitor to be charged by the current or to discharge through the controlled transistor. The data latch, in response to the timing information from each of the first decoding units and the latch signal from the second decoding unit, determines the data in the MLC.

18 Claims, 11 Drawing Sheets

CIRCUIT FOR SENSING MLC FLASH MEMORY

BACKGROUND OF THE INVENTION

1. Technical Field

The present invention generally relates to multi-level cell (MLC) flash memory and, more particularly, to a circuit for sensing an MLC flash memory.

2. Background

Figure 1:
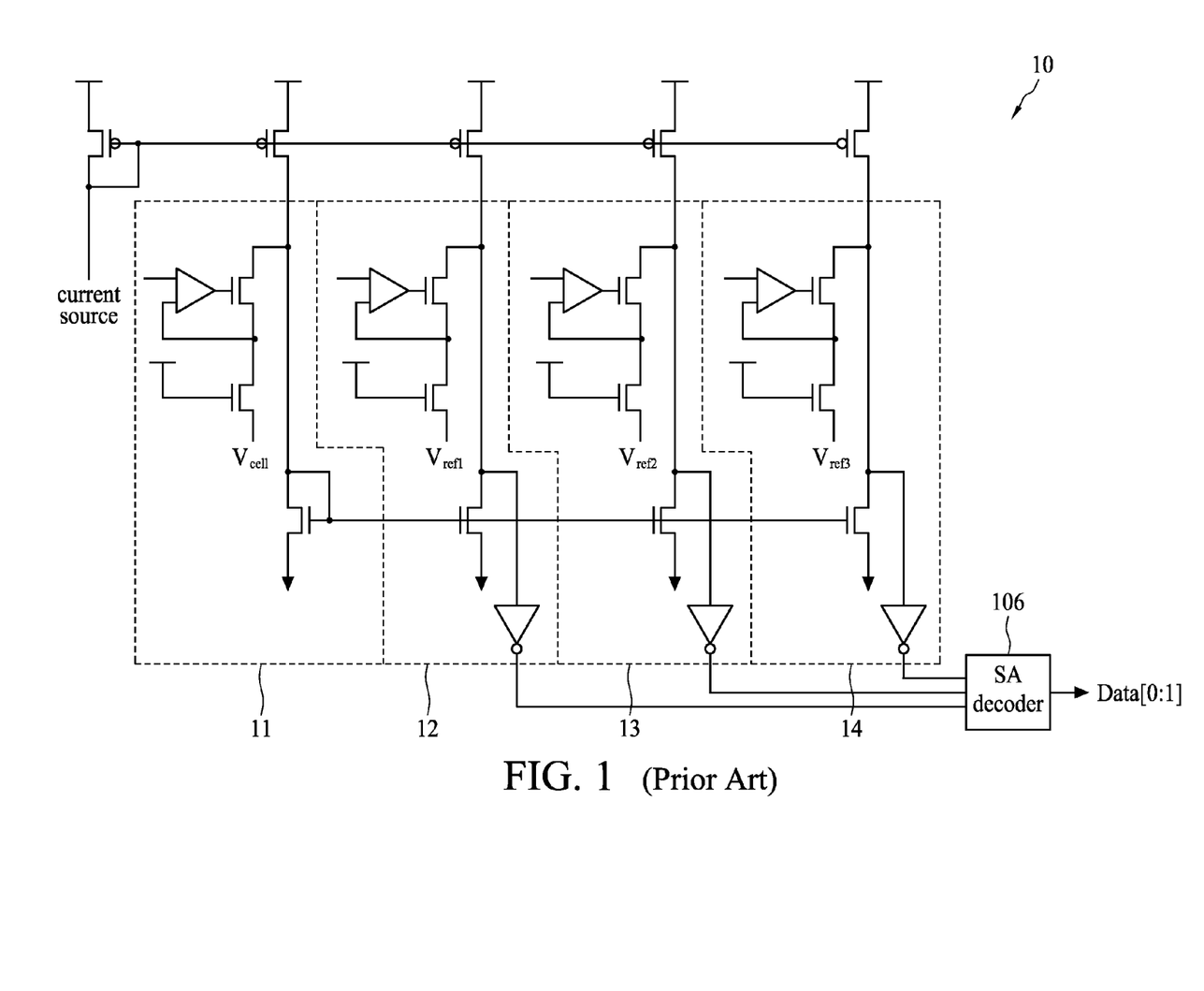
FIG. 1 is a circuit diagram of a circuit for an MLC flash memory in prior art.

A multi-level cell (MLC) refers to a memory cell having a plurality of threshold voltages. To detect the threshold voltage of an MLC, a sensing circuit needs to decode multi-bit data that represent the threshold voltages. FIG. 1 is a circuit diagram of a circuit 10 for sensing an MLC flash memory in prior art. Referring to FIG. 1, the circuit 10 includes decoding units 11 to 14, wherein a cell voltage $V_{cell}$ in the decoding unit 11 is compared with voltages $V_{ref1}$, $V_{ref2}$ and $V_{ref3}$ in the decoding units 12, 13 and 14, respectively so that multi-bit data can be decoded at a sense amplifier (SA) decoder 106.

Figure 2:
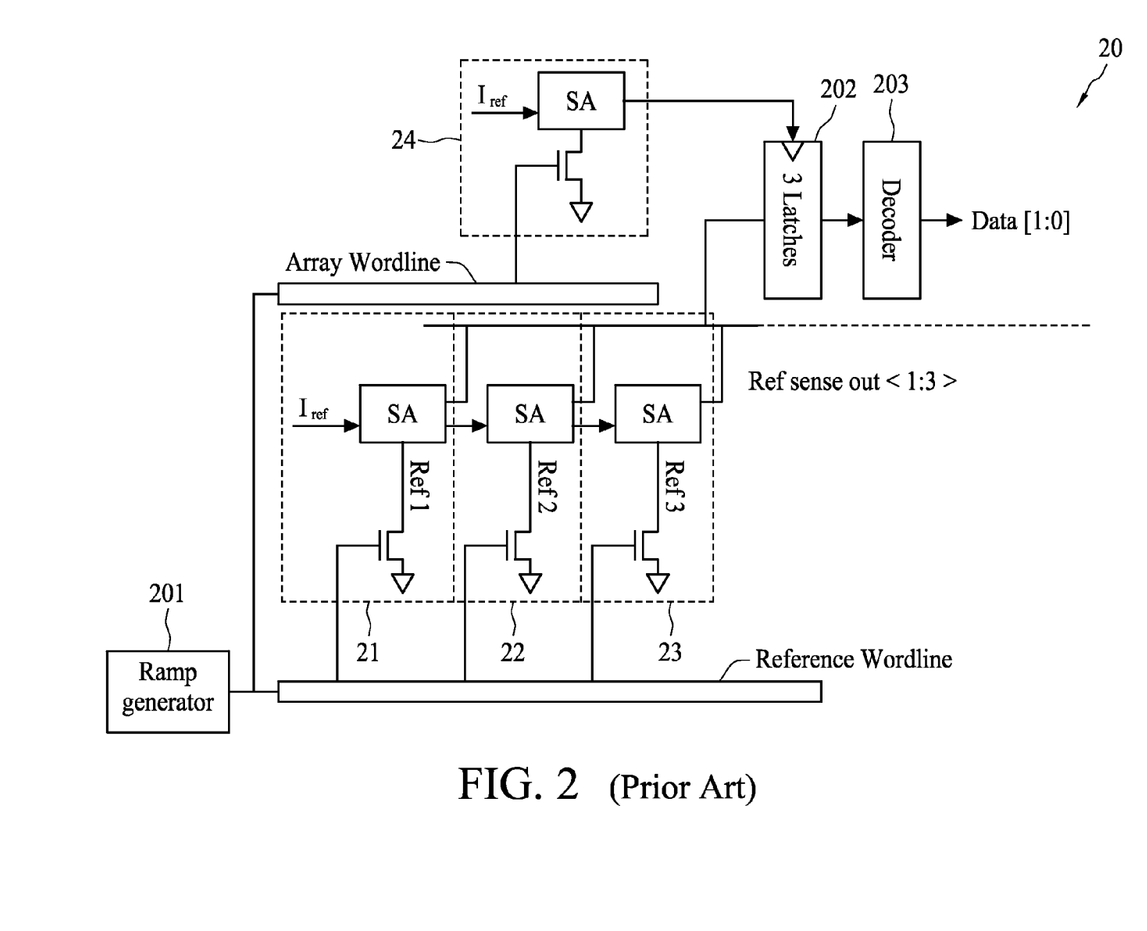
FIG. 2 is a circuit diagram of another circuit for sensing an MLC flash memory in prior art.
Figure 3:
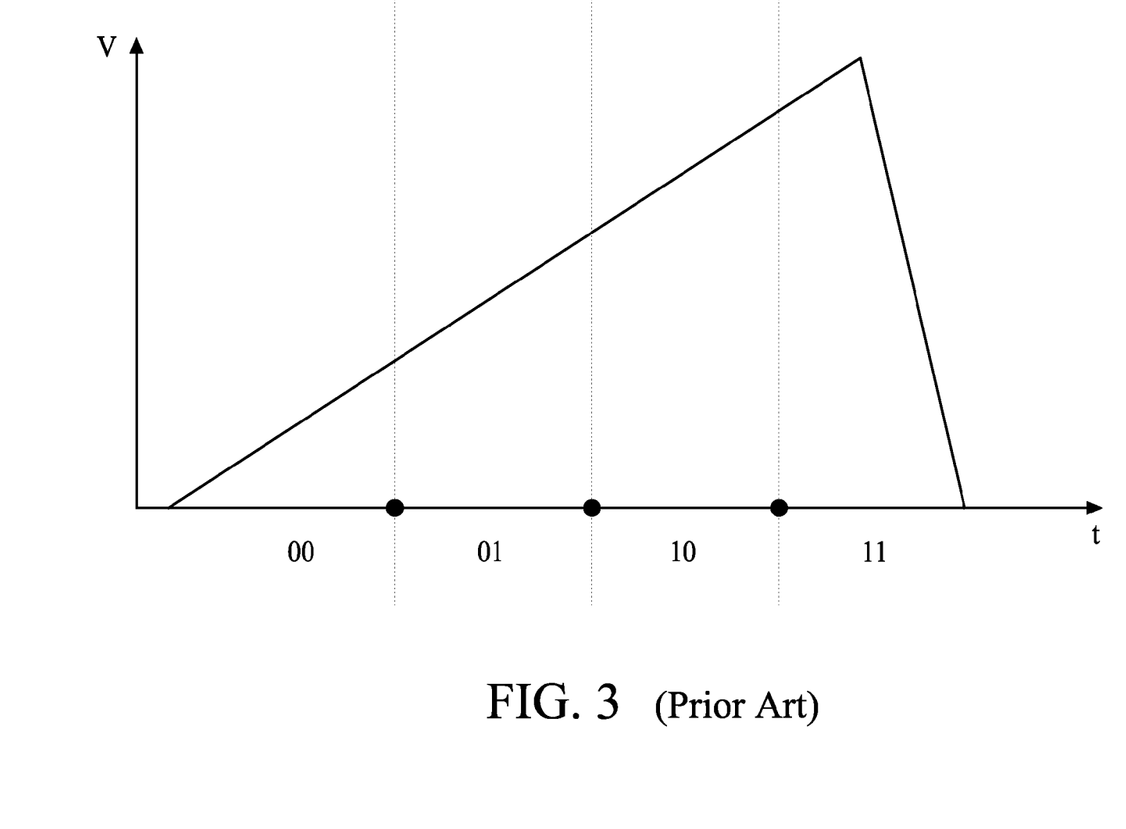
FIG. 3 is a schematic diagram showing an exemplary ramp signal for sensing multi-bit data.

FIG. 2 is a circuit diagram of another circuit 20 for sensing an MLC flash memory in prior art. Referring to FIG. 2, the circuit 20 includes a ramp generator 201 and decoding units 21 to 24. The ramp generator 201 provides a ramp signal to the decoding units 21 to 24. Latches 202 latch outputs from the decoding units 21 to 23 at different latch time points so that multi-bit data can be decoded at a decoder 203. FIG. 3 is a schematic diagram showing an exemplary ramp signal for sensing multi-bit data.

The above-mentioned circuits 10 and 20 may be complex and take up a large area, and may have low response speed or large power consumption. It may thus be desirable to have a circuit that can address the issues of the prior art circuits.

SUMMARY

Embodiments of the present invention include a circuit for sensing a multi-level cell (MLC) flash memory. The circuit comprises a plurality of first decoding units each providing a timing information and including a controlled transistor to allow a current to pass therethrough, and a capacitor to be charged by the current or to discharge through the controlled transistor, a second decoding unit providing a latch signal and including a controlled transistor to allow a current to pass therethrough, the magnitude of the current being associated with data in an MLC, and a capacitor to be charged by the current or to discharge through the controlled transistor, and a data latch, in response to the timing information from each of the first decoding units and the latch signal from the second decoding unit, to determine the data in the MLC.

Some embodiments of the present invention may further include a circuit for sensing a multi-level cell (MLC) flash memory. The circuit comprises a first current-capacitor circuit including a first controlled transistor to allow a first current to flow therethrough and a first capacitor to be charged by the first current, and providing a first timing information based on a first charging time associated with the first current and the first capacitor, and a second current-capacitor circuit including a second controlled transistor to allow a second current to flow therethrough and a second capacitor to be charged by the second current, and providing a second timing information based on a second charging time associated with the second current and the second capacitor, wherein the first charging time is different from the second charging time.

Embodiments of the present invention may also include a circuit for sensing a multi-level cell (MLC) flash memory. The circuit comprises a first current-capacitor circuit including a first controlled transistor to allow a first current to flow therethrough and a first capacitor to discharge through the first controlled transistor, and providing a first timing information based on a first discharging time associated with the first current and the first capacitor, and a second current-capacitor circuit including a second controlled transistor to allow a second current to flow therethrough and a second capacitor to discharge through the second controlled transistor, and providing a second timing information based on a second discharging time associated with the second current and the second capacitor, wherein the first discharging time is different from the second discharging time.

DETAILED DESCRIPTION

Figure 4:
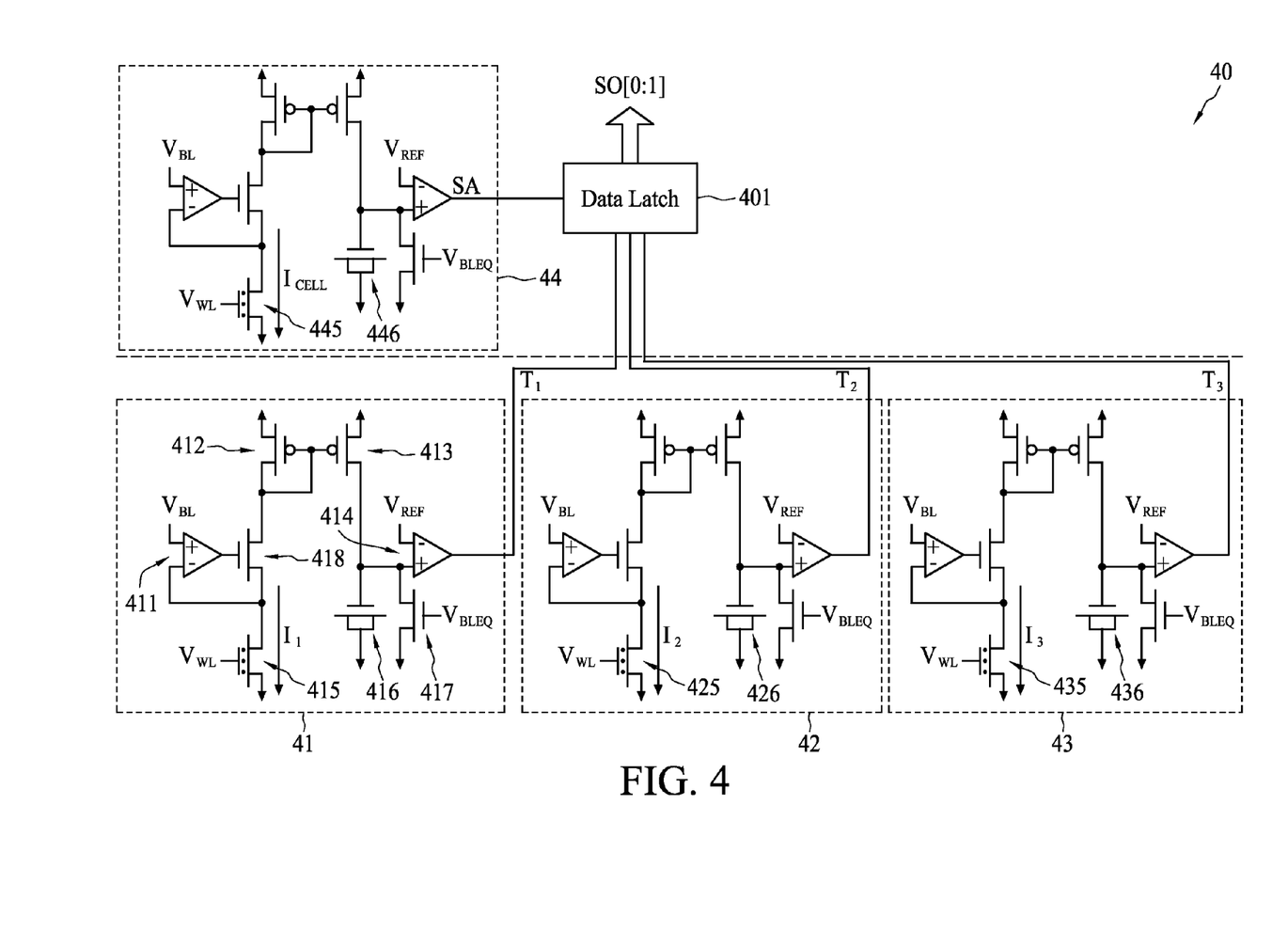
FIG. 4 is a circuit diagram of a circuit for sensing an MLC flash memory in accordance with an embodiment of the present invention.

FIG. 4 is a circuit diagram of a circuit 40 for sensing an MLC flash memory in accordance with an embodiment of the present invention Referring to FIG. 4, the circuit 40 includes a data latch 401, a number of first decoding units 41 to 43, and a number of second decoding units 44 (for purposes of simplicity, only one such second decoding unit is shown). Each of the first and second decoding units 41 to 44 may include a current-capacitor circuit to determine a latch time, as will be explained in detail in paragraphs below.

The first decoding units 41 to 43 specifically include a first current-capacitor circuit 41, a second current-capacitor circuit 42 and a third current-capacitor circuit 43. In the present embodiment, three first decoding units are used. In other examples, however, more such first decoding units may be used. The number of the first decoding units may depend on the size of the multi-bit data of the cell. Specifically, for an N-bit cell, the number of the first decoding units is $2^N-1$, where N is a natural number. For purposes of convenience in discussion, it is assumed that the cells in the MLC memory contain 2-bit data (N=2) and accordingly three first decoding units 41 to 43 are employed.

The first current-capacitor circuit 41 may include a first controlled transistor 415, a first capacitor 416 and a current generator that comprises a first operational amplifier 411, a metal-oxide-semiconductor (MOS) transistor 418 and current-mirror transistors 412 and 413. The first operational amplifier 411 includes a non-inverting input coupled to a voltage $V_{BL}$, which in one example may be approximately 0.75 volts (V), and an inverting input coupled to a source terminal of the MOS transistor 418 and to a drain terminal of the first controlled transistor 415, and includes an output coupled to a gate of the MOS transistor 418. Furthermore, the first controlled transistor 415, which may be biased by a constant voltage $V_{WL}$, is configured to allow a first reference current $I_1$ to flow therethrough, and includes a source terminal coupled to ground or a reference level. The current-mirror transistors 412 and 413 may each include a source terminal coupled to a voltage source $V_{DD}$.

The first current-capacitor circuit 41 may further include a second operational amplifier 414, which may serve as a comparator. The second operational amplifier 414 includes an inverting input to receive a reference voltage $V_{REF}$ of approximately 1V, and a non-inverting input coupled to one end of the first capacitor 416 and to a drain terminal of a reset transistor 417. The reset transistor 417 includes a gate to receive a voltage $V_{BLEQ}$ and a source coupled to ground.

In operation, a mirrored current substantially the same in magnitude as the first reference current $I_1$ charges the first capacitor 416. When the first capacitor 416 is fully charged in a first time period, the second operational amplifier 414 outputs a first signal $T_1$ at a time $t_1$ to the data latch 401. The first time period, during which the first capacitor 416 is charged from an uncharged state to a fully charged state, is determined by the magnitude of $I_1$ and the capacitance of the first capacitor 416. Furthermore, the first signal $T_1$ may be sent to the data latch 401 immediately after the first time period.

The second current-capacitor circuit 42 may be similar to the first current-capacitor circuit 41 except that, for example, a second controlled transistor 425 is configured to allow a second reference current $I_2$ to flow therethrough.

In operation, a mirrored current substantially the same in magnitude as the second reference current $I_2$ charges a second capacitor 426, which has substantially the same capacitance as the first capacitor 416. When the second capacitor 426 is fully charged in a second time period, a second signal $T_2$ is sent to the data latch 401 at a time $t_2$. The second time period, during which the second capacitor 426 is charged from an uncharged state to a fully charged state, is determined by the magnitude of $I_2$ and the capacitance of the second capacitor 426. Furthermore, the second signal $T_2$ may be sent to the data latch 401 immediately after the second time period. In the present embodiment, the magnitude of $I_2$ is smaller than that of $I_1$ and, as a result, the second time period is longer than the first time period. The magnitude of the reference current, for example, $I_1$ may be determined by a threshold voltage of the first controlled transistor 415.

Moreover, the third current-capacitor circuit 43 may be similar to the first current-capacitor circuit 41 except that, for example, a third controlled transistor 435 is configured to allow a third reference current $I_3$ to flow therethrough.

In operation, a mirrored current substantially the same in magnitude as the third reference current $I_3$ charges a third capacitor 436, which has substantially the same capacitance as the first capacitor 416. When the third capacitor 436 is fully charged in a third time period, a third signal $T_3$ is sent to the data latch 401 at a time $t_3$. The third time period, during which the third capacitor 436 is charged from an uncharged state to a fully charged state, is determined by the magnitude of $I_3$ and the capacitance of the third capacitor 436. Furthermore, the third signal $T_3$ may be sent to the data latch 401 immediately after the third time period. In the present embodiment, the magnitude of $I_3$ is smaller than that of $I_2$ and, as a result, the third time period is longer than the second time period, and in turn longer than the first time period.

As to the second decoding units, each of the second decoding units may include a fourth current-capacitor circuit 44, which may be similar to the first current-capacitor circuit 41 except that, for example, a cell current $I_{CELL}$ flowing through a fourth controlled transistor 445 has a magnitude depending on cell data. Specifically, cell currents $I_{CELL}$ are different as the data contained in the cells are different.

In operation, a mirrored current substantially the same in magnitude as the cell current $I_{CELL}$ charges a fourth capacitor 446, which has substantially the same capacitance as the first capacitor 416. When the fourth capacitor 446 is fully charged in a fourth time period, a latch signal SA is sent to the data latch 401 at a time $t_{SA}$. The fourth time period, during which the fourth capacitor 446 is charged from an uncharged state to a fully charged state, is determined by the magnitude of $I_{CELL}$ and the capacitance of the fourth capacitor 446. Furthermore, the latch signal SA may be sent to the data latch 401 immediately after the fourth time period.

The data latch 401 may, in response to the latch signal SA from the fourth current-capacitor circuit 44 and the state (assertion or negation) of the signals $T_1$, $T_2$ and $T_3$, provide a 2-bit output that represents the cell data.

Figure 5:
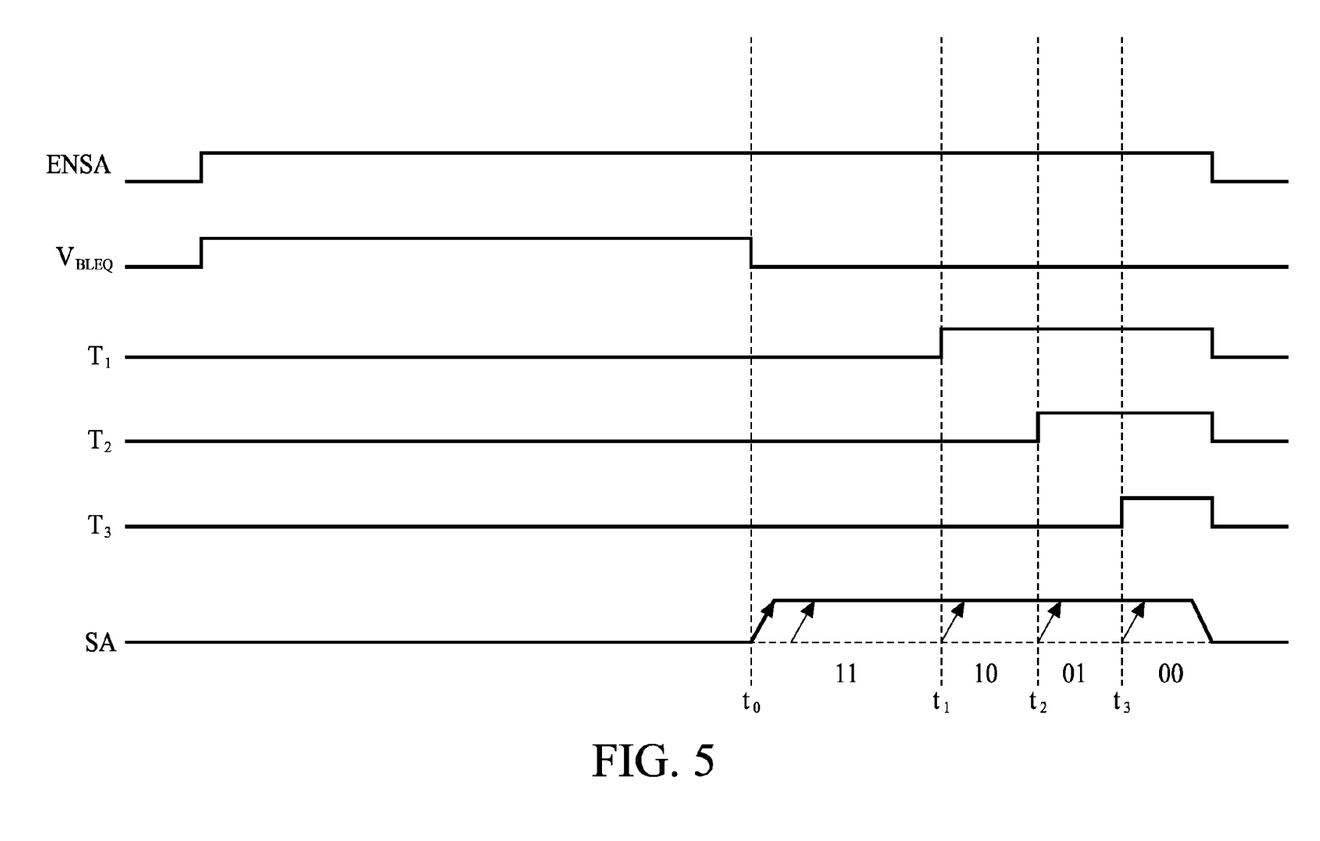
FIG. 5 is a timing diagram of the circuit illustrated in FIG. 4.

FIG. 5 is a timing diagram of the circuit 40 illustrated in FIG. 4. Referring to FIG. 5, an ENSA signal is asserted during a sensing period. In one embodiment, the sensing period may be approximately 55 nanoseconds (ns). Furthermore, when ENSA is asserted, the $V_{BLEQ}$ signal is asserted, whereby the capacitors 416, 426, 436 and 446 may be discharged. In one embodiment, the assertion period of $V_{BLEQ}$ is approximately 30 ns. After the capacitors 416, 426, 436 and 446 are discharged, $V_{BLEQ}$ is negated, allowing the capacitors 416, 426, 436 and 446 to be charged.

Also referring to FIG. 4, given that $I_1$ is greater than $I_2$, which in turn is greater than $I_3$, and the capacitors 416, 426, 436 and 446 have substantially the same capacitance, the first capacitor 416 is fully charged at time $t_1$, while the second capacitor 426 and the third capacitor 436 are subsequently fully charged at $t_2$ and $t_3$, respectively. Accordingly, the signals $T_1$, $T_2$ and $T_3$ are asserted at time $t_1$, $t_2$ and $t_3$, respectively.

In the present embodiment according to the present invention, the data latch 401 outputs "11" if none of $T_1$, $T_2$ and $T_3$ is asserted as SA is asserted, and outputs "00" if all of $T_1$, $T_2$ and $T_3$ are asserted as SA is asserted. Moreover, the data latch 401 outputs "10" if only $T_1$ is asserted as SA is asserted, and outputs "01" if only $T_3$ is not asserted as SA is asserted.

Figure 6:
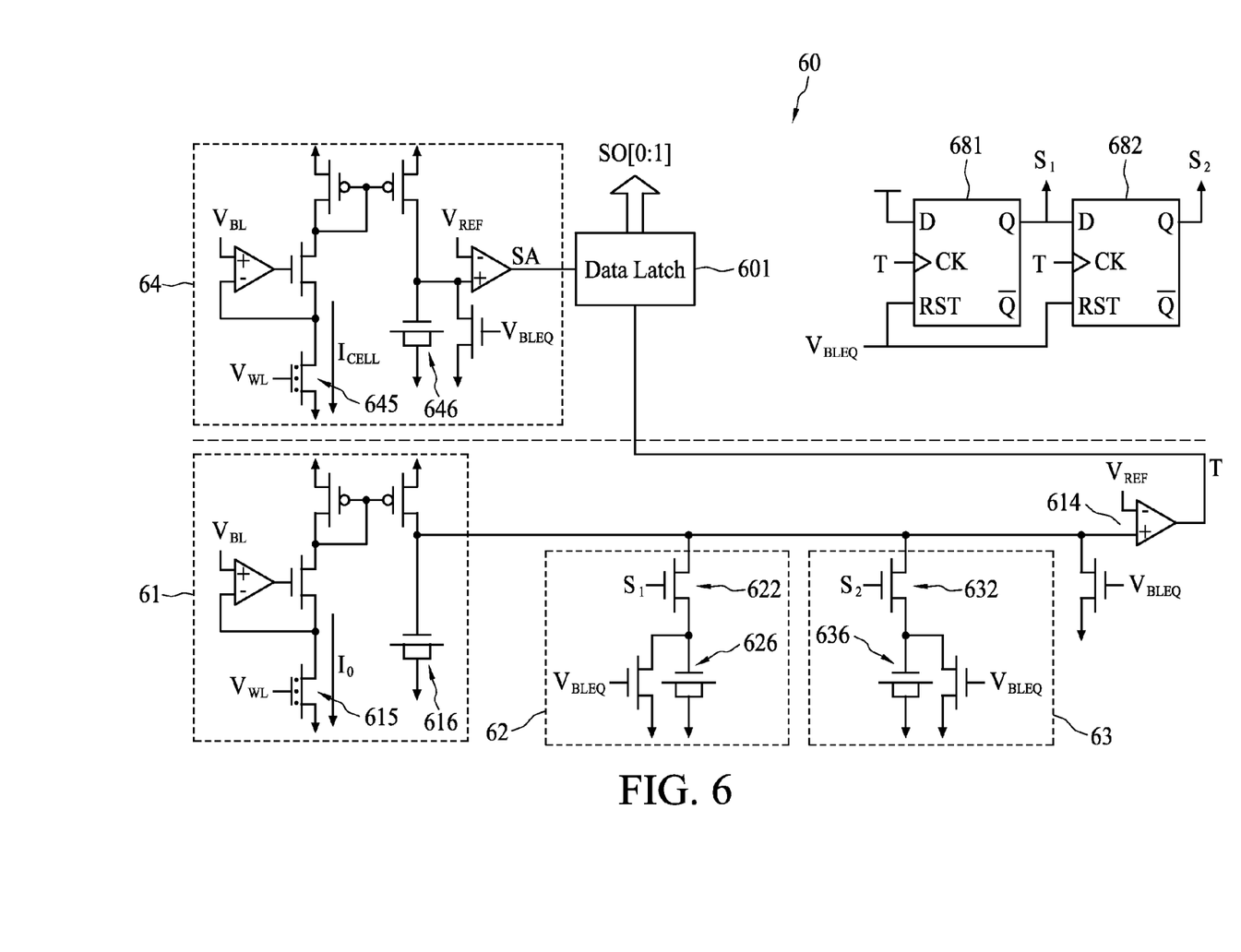
FIG. 6 is a circuit diagram of a circuit for sensing an MLC flash memory in accordance with another embodiment of the present invention.

FIG. 6 is a circuit diagram of a circuit 60 for sensing an MLC flash memory in accordance with another embodiment of the present invention. Referring to FIG. 6, the circuit 60 includes a data latch 601, a number of first decoding units 61 to 63, and a number of second decoding units 64 (for purposes of simplicity, only one such second decoding unit is shown). Each of the first and second decoding units 61 to 64 may include a current-capacitor circuit to determine a latch time.

The first decoding units 61 to 63 specifically include a first current-capacitor circuit 61, a second current-capacitor circuit 62 and a third current-capacitor circuit 63. The first current-capacitor circuit 61 may be similar to the first current-capacitor circuit 41 illustrated in FIG. 4 except, for example, a first reference current $I_0$ and a first capacitor 616, which will be discussed in paragraphs below.

The second current-capacitor circuit 62 includes a first switch 622 in the form of a controlled transistor and a second capacitor 626. The transistor 622 includes a gate controlled by a first switch signal $S_1$, a drain terminal coupled to a non-inverting input of a second operational amplifier 614 of the first current-capacitor circuit 61, to one end of the first capacitor 616, and to one end of the second capacitor 626. The first switch signal $S_1$ is an output of a first latch 681.

Likewise, the third current-capacitor circuit 63 includes a second switch 632 in the form of a controlled transistor and a third capacitor 636. The transistor 632 includes a gate controlled by a second switch signal $S_2$, a drain terminal coupled to the non-inverting input of the second operational amplifier 614 of the first current-capacitor circuit 61, to the one end of the first capacitor 616, and to one end of the third capacitor 636. The second switch signal $S_2$ is an output of a second latch 682. Moreover, the output $S_1$ of the first latch 681 serves as a data input of the second latch 682.

In operation, a mirrored current substantially the same in magnitude as the first reference current $I_0$ charges the first capacitor 616. When the first capacitor 616 is fully charged in a first time period, the second operational amplifier 614 outputs a first signal T at a time $t_1$ to the data latch 601. The first time period, during which the first capacitor 416 is charged from an uncharged state to a fully charged state, is determined by the magnitude of $I_0$ and the capacitance of the first capacitor 616. Specifically, when the first capacitor 616 is not fully charged, the first signal T is kept at a logic low state, and so are the first switch signal $S_1$ and the second switch signal $S_2$. Accordingly, the transistors 622 and 632 are turned off and only the first capacitor 616 is charged by the first reference current $I_0$. When T is asserted, the first latch 681 toggles and the first switch signal $S_1$ is asserted, which turns on the first switch 622 and exposes the second capacitor 626 to the first capacitor 616. At this time, due to charge sharing effect, the first capacitor 616 becomes not fully charged, which swiftly changes the signal T from logic high to logic low. In view of the capacitors 616 and 626 being in the order of pico-farads, the signal T may change its state from assertion to negation so fast that the signal T may resemble a glitch.

Subsequently, the second capacitor 626 is fully charged in a second time period and the signal T is again asserted. At this time, the second latch 682 toggles and the second switch signal $S_2$ is asserted, which turns on the second switch 632 and exposes the third capacitor 636 to the first capacitor 616 and the second capacitor 626. Due to charge sharing effect, the first capacitor 616 becomes not fully charged, which swiftly changes the signal T from logic high to logic low. As previously discussed, the signal T may change its state from assertion to negation so fast that the signal T may resemble a glitch. Subsequently, the third capacitor 636 is fully charged in a third time period and the signal T is again asserted.

As to the second decoding units, each of the second decoding units may include a fourth current-capacitor circuit 64, which may be similar to the fourth current-capacitor circuit 44 illustrated in FIG. 4 and need not be further discussed.

In the present embodiment, by means of current mirror function, the same reference current $I_0$ may flow in the first, second and third current-capacitor circuits 61, 62 and 63. Furthermore, the first, second and third capacitors 616, 626 and 636 may have different capacitances. In other embodiments, however, the first, second and third capacitors 616, 626 and 636 have substantially the same capacitance.

The data latch 601 may, in response to a latch signal SA from the fourth current-capacitor circuit 64, and the state (assertion or negation) of the signals T, $S_1$ and $S_2$, provide a 2-bit output that represents the cell data.

Figure 7:
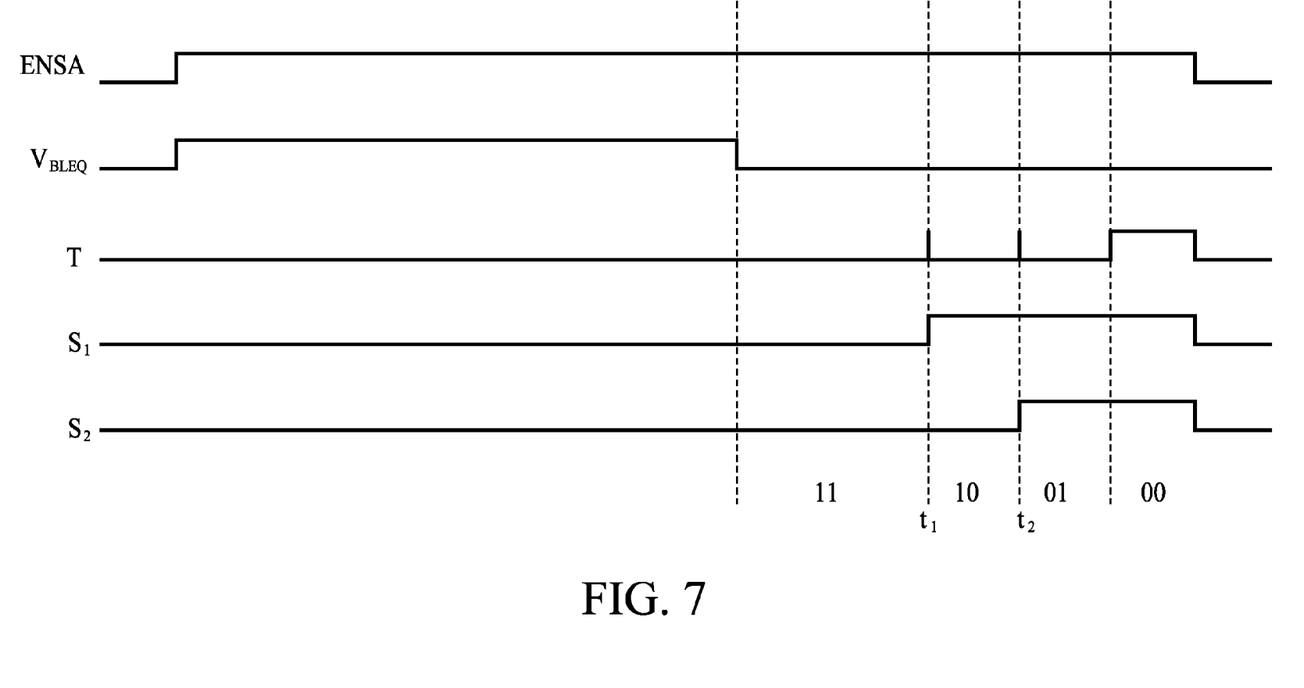
FIG. 7 is a timing diagram of the circuit illustrated in FIG. 6.

FIG. 7 is a timing diagram of the circuit 60 illustrated in FIG. 6. Referring to FIG. 7, the signal T may resemble a glitch as the first switch signal $S_1$ is asserted at time $t_1$ and as the second switch signal is asserted at time $t_2$. In the present embodiment according to the present invention, the data latch 601 outputs "11" if none of T, $S_1$ and $S_2$ is asserted as SA is asserted, and outputs "00" if all of T, $S_1$ and $S_2$ are asserted as SA is asserted. Moreover, the data latch 601 outputs "10" if only $S_1$ is asserted as SA is asserted, and outputs "01" if only T is not asserted as SA is asserted.

Figure 8:
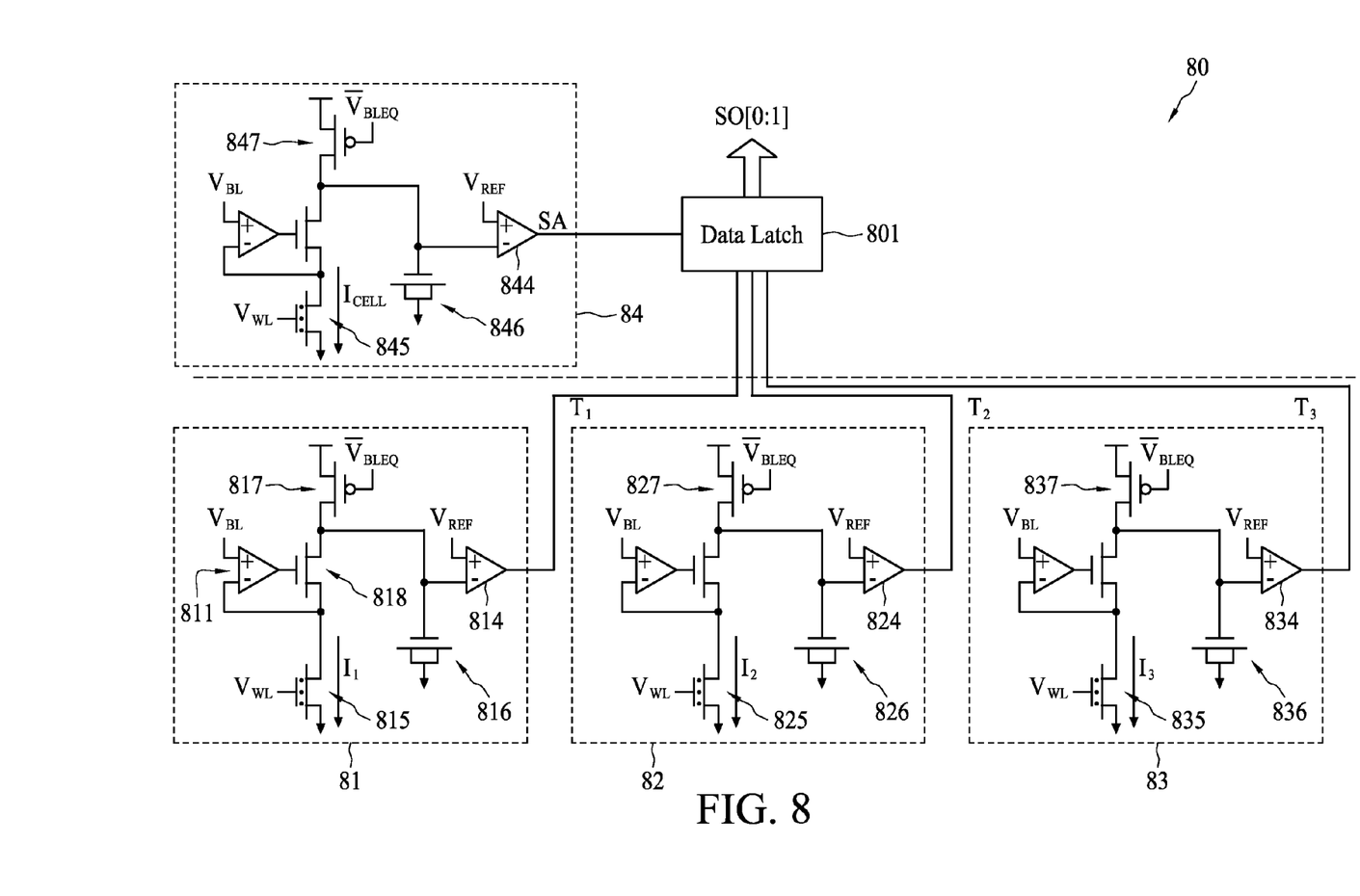
FIG. 8 is a circuit diagram of a circuit for sensing an MLC flash memory in accordance with yet another embodiment of the present invention.

FIG. 8 is a circuit diagram of a circuit 80 for sensing an MLC flash memory in accordance with yet another embodiment of the present invention. Referring to FIG. 8, the circuit 80 includes a data latch 801, a number of first decoding units 81 to 83, and a number of second decoding units 84 (for purposes of simplicity, only one such second decoding unit is shown). Each of the first and second decoding units 81 to 84 may include a current-capacitor circuit to determine a latch time, as will be explained in detail in paragraphs below.

The first decoding units 81 to 83 specifically include a first current-capacitor circuit 81, a second current-capacitor circuit 82 and a third current-capacitor circuit 83. The first current-capacitor circuit 81 may include a first controlled transistor 815, a first capacitor 816 and a bias generator that comprises a first operational amplifier 811 and a MOS transistor 818. The first operational amplifier 811 includes a non-inverting input coupled to $V_{BL}$, and an inverting input coupled to a source terminal of the MOS transistor 818 and to a drain terminal of the first controlled transistor 815, and includes an output coupled to a gate of the MOS transistor 818. Furthermore, the first controlled transistor 815, which may be biased by $V_{WL}$, is configured to allow a first reference current $I_1$ to flow therethrough.

The first current-capacitor circuit 81 may further include a second operational amplifier 814, which may serve as a comparator. The second operational amplifier 814 includes a non-inverting input coupled to $V_{REF}$, and an inverting input coupled to one end of the first capacitor 816 and to a drain terminal of a reset transistor 817.

In operation, when the signal $V_{BLEQ}$ is asserted, the transistor 817 is turned on, charging the first capacitor 816 to $V_{DD}$. Since the first capacitor 816 is coupled to the inverting input of the second operational amplifier 814, a first signal $T_1$ as an output of the second operational amplifier 814 is not asserted. Subsequently, when the signal $V_{BLEQ}$ is negated, the transistor 817 is turned off, causing the first capacitor 816 to discharge through the first controlled transistor 815. When the first capacitor 816 is completely discharged in a first time period, the first signal $T_1$ sent from the second operational amplifier 814 to the data latch 801 is asserted. The first time period, during which the first capacitor 816 is discharged from a fully charged state to a completely discharged state, is determined by the magnitude of $I_1$ and the capacitance of the first capacitor 816.

The second current-capacitor circuit 82 may be similar to the first current-capacitor circuit 81 except that, for example, a second controlled transistor 825 is configured to allow a second reference current $I_2$ to flow therethrough.

In operation, when the signal $V_{BLEQ}$ is asserted, a transistor 827 is turned on, charging a second capacitor 826 to $V_{DD}$. Since the second capacitor 826 is coupled to an inverting input of a second operational amplifier 824, a second signal $T_2$ as an output of the second operational amplifier 824 is not asserted. Subsequently, when the signal $V_{BLEQ}$ is negated, the transistor 827 is turned off, causing the second capacitor 826 to discharge through the second controlled transistor 825. When the second capacitor 826 is completely discharged in a second time period, the second signal $T_2$ sent from the second operational amplifier 824 to the data latch 801 is asserted. The second time period, during which the second capacitor 826 is discharged from a fully charged state to a completely discharged state, is determined by the magnitude of $I_2$ and the capacitance of the second capacitor 826.

Moreover, the third current-capacitor circuit 83 may be similar to the first current-capacitor circuit 81 except that, for example, a third controlled transistor 835 is configured to allow a third reference current $I_3$ to flow therethrough.

In operation, when the signal $V_{BLEQ}$ is asserted, a transistor 837 is turned on charging a third capacitor 836 to $V_{DD}$. Since the third capacitor 836 is coupled to an inverting input of a second operational amplifier 834, a third signal $T_3$ as an output of the second operational amplifier 834 is not asserted. Subsequently, when the signal $V_{BLEQ}$ is negated, the transistor 837 is turned off, causing the third capacitor 836 to discharge through the third controlled transistor 835. When the third capacitor 836 is completely discharged in a third time period, the third signal $T_3$ sent from the second operational amplifier 834 to the data latch 801 is asserted. The third time period, during which the third capacitor 836 is discharged from a fully charged state to a completely discharged state, is determined by the magnitude of $I_3$ and the capacitance of the third capacitor 836.

As to the second decoding units, each of the second decoding units may include a fourth current-capacitor circuit 84, which may be similar to the first current-capacitor circuit 81 except that, for example, a cell current $I_{CELL}$ flowing through a fourth controlled transistor 845 has a magnitude depending on cell data. Specifically, cell currents $I_{CELL}$ are different as the data contained in the cells are different.

In operation, when the signal $V_{BLEQ}$ is asserted, a transistor 847 is turned on, charging a fourth capacitor 846 to $V_{DD}$. Since the fourth capacitor 846 is coupled to an inverting input of a second operational amplifier 844, a latch signal SA as an output of the second operational amplifier 844 is not asserted. Subsequently, when the signal $V_{BLEQ}$ is negated, the transistor 847 is turned off, causing the fourth capacitor 846 to discharge through the fourth controlled transistor 845. When the fourth capacitor 846 is completely discharged in a fourth time period, the latch signal SA sent from the second operational amplifier 844 to the data latch 801 is asserted. The fourth time period, during which the fourth capacitor 846 is discharged from a fully charged state to a completely discharged state, is determined by the magnitude of $I_{CELL}$ and the capacitance of the fourth capacitor 846.

The data latch 801 may, in response to the latch signal SA from the fourth current-capacitor circuit 84 and the state (assertion or negation) of the signals $T_1$, $T_2$ and $T_3$, provide a 2-bit output that represents the cell data.

Figure 9:
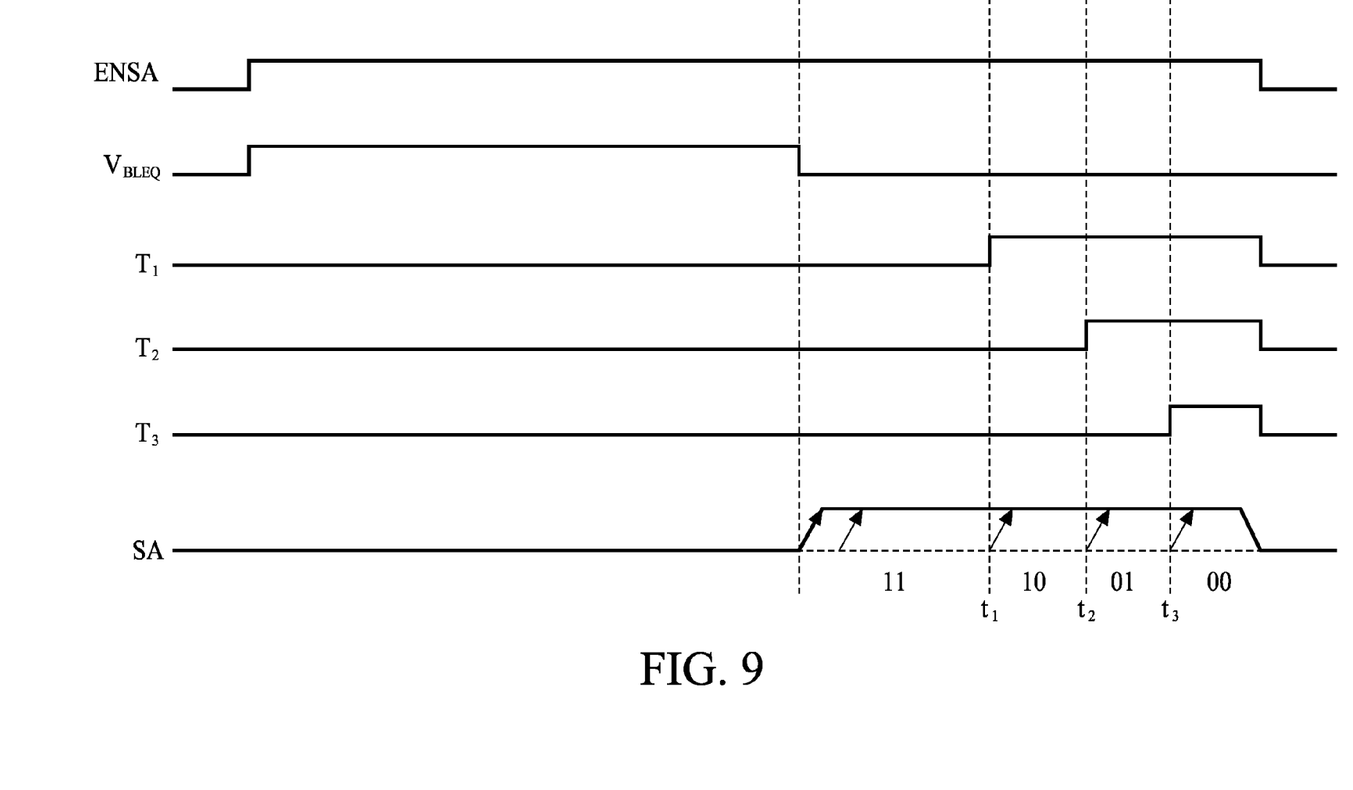
FIG. 9 is a timing diagram of the circuit illustrated in FIG. 8.

FIG. 9 is a timing diagram of the circuit 80 illustrated in FIG. 8. Referring to FIG. 9, when ENSA is asserted, the $V_{BLEQ}$ signal is asserted, whereby the capacitors 816, 826, 836 and 846 may be charged. After the capacitors 816, 826, 836 and 846 are charged, $V_{BLEQ}$ is negated, allowing the capacitors 816, 826, 836 and 846 to be discharged.

Also referring to FIG. 8, given that $I_1$ is greater than $I_2$, which in turn is greater than $I_3$, and the capacitors 816, 826, 836 and 846 have substantially the same capacitance, the first capacitor 816 is fully charged at time $t_1$, while the second capacitor 826 and the third capacitor 836 are subsequently fully charged at $t_2$ and $t_3$, respectively. Accordingly, the signals $T_1$, $T_2$ and $T_3$ are asserted at time $t_1$, $t_2$ and $t_3$, respectively.

In the present embodiment according to the present invention, the data latch 801 outputs "11" if none of $T_1$, $T_2$ and $T_3$ is asserted as SA is asserted, and outputs "00" if all of $T_1$, $T_2$ and $T_3$ are asserted as SA is asserted. Moreover, the data latch 801 outputs "10" if only $T_1$ is asserted as SA is asserted, and outputs "01" if only $T_3$ is not asserted as SA is asserted.

Figure 10:
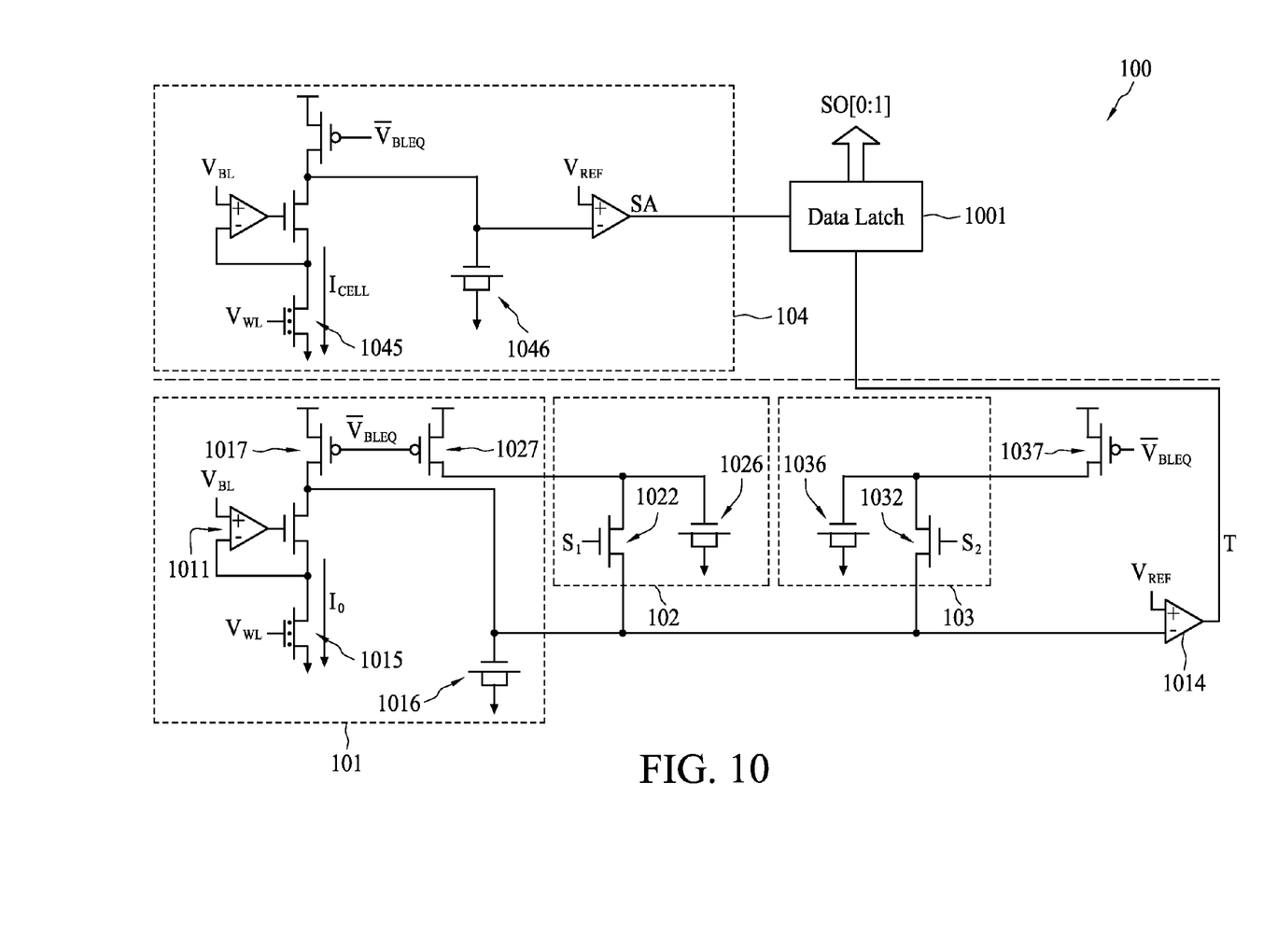
FIG. 10 is a circuit diagram of a circuit for sensing an MLC flash memory in accordance with still another embodiment of the present invention.

FIG. 10 is a circuit diagram of a circuit 100 for sensing an MLC flash memory in accordance with still another embodiment of the present invention. Referring to FIG. 10, the circuit 100 includes a data latch 1001, a number of first decoding units 101 to 103, and a number of second decoding units 104 (for purposes of simplicity, only one such second decoding unit is shown). Each of the first and second decoding units 101 to 104 may include a current-capacitor circuit to determine a latch time.

The first decoding units 101 to 103 specifically include a first current-capacitor circuit 101, a second current-capacitor circuit 102 and a third current-capacitor circuit 103. The first current-capacitor circuit 101 may be similar to the first current-capacitor circuit 81 illustrated in FIG. 8 except, for example, a first reference current $I_0$ and a first capacitor 1016, which will be discussed in paragraphs below.

The second current-capacitor circuit 82 includes a first switch 1022 in the form of a controlled transistor and a second capacitor 1026. The transistor 1022 includes a gate controlled by a first switch signal $S_1$, a source terminal coupled to an inverting input of a second operational amplifier 1014 of the first current-capacitor circuit 101 and to one end of the first capacitor 1016, and a drain terminal coupled to one end of the second capacitor 1026. The first switch signal $S_1$ is an output of a first latch (not shown), which may be the same as the first latch 681 illustrated in FIG. 6. Furthermore, the one end of the second capacitor 1026 is coupled to a drain terminal of a transistor 1027, which includes a gate to receive the signal $V_{BLEQ}$.

Likewise, the third current-capacitor circuit 103 includes a second switch 1032 in the form of a controlled transistor and a third capacitor 1036. The transistor 1032 includes a gate controlled by a second switch signal $S_2$, a source terminal coupled to the inverting input of the second operational amplifier 1014 of the first current-capacitor circuit 101 and to the one end of the first capacitor 1016, and a drain terminal coupled to one end of the third capacitor 1036. The second switch signal $S_2$ is an output of a second latch (not shown), which may be the same as the second latch 682 illustrated in FIG. 6. Furthermore, the one end of the third capacitor 1036 is coupled to a drain terminal of a transistor 1037, which includes a gate to receive the signal $V_{BLEQ}$.

In operation, when the signal $V_{BLEQ}$ is asserted, the transistor 1017 is turned on, allowing the first capacitor 1016 to be charged. Meanwhile, the transistors 1027 and 1037 are also turned on by the signal $V_{BLEQ}$, allowing the second capacitor 1026 and the third capacitor 1036 to be charged, respectively.

Subsequently, when the signal $V_{BLEQ}$ is negated, the transistor 1017 is turned off, and the first capacitor 1016 is discharged through the first controlled transistor 1015. At this time, a first signal T at the output of the second operational amplifier 1014 is asserted, the first latch (also referring to the first latch 681 in FIG. 6) toggles and the first switch signal $S_1$ is asserted, which turns on the first switch 1022 and exposes the second capacitor 1026 to the first capacitor 1016. A current from the fully charged second capacitor 1026 charges the discharging first capacitor 1016, which swiftly changes the signal T from logic high to logic low. The signal T may change its state from assertion to negation so fast that the signal T may resemble a glitch.

After the second capacitor 1026 is completely discharged, the signal T is again asserted. At this time, the second latch (also referring to the first latch 682 in FIG. 6) toggles and the second switch signal $S_2$ is asserted, which turns on the second switch 1032 and exposes the third capacitor 1036 to the first capacitor 1016 and the second capacitor 1026. A current from the fully charged third capacitor 1036 charges the discharging first and second capacitors 1016 and 1026, which swiftly changes the signal T from logic high to logic low. As previously discussed, the signal T may change its state from assertion to negation so fast that the signal T may resemble a glitch. Subsequently, the third capacitor 1036 is completely discharged and the signal T is again asserted.

As to the second decoding units, each of the second decoding units may include a fourth current-capacitor circuit 104, which may be similar to the fourth current-capacitor circuit 84 illustrated in FIG. 8 and provides a latch signal SA.

In the present embodiment, the same reference current $I_0$ may flow in the first, second and third current-capacitor circuits 101, 102 and 103. Furthermore, the first, second and third capacitors 1016, 1026 and 1036 may have different capacitances. In other embodiments, however, the first, second and third capacitors 1016, 1026 and 1036 have substantially the same capacitance.

The data latch 1001 may, in response to the latch signal SA from the fourth current-capacitor circuit 104 and the state (assertion or negation) of the signals T, $S_1$ and $S_2$, provide a 2-bit output that represents the cell data.

Figure 11:
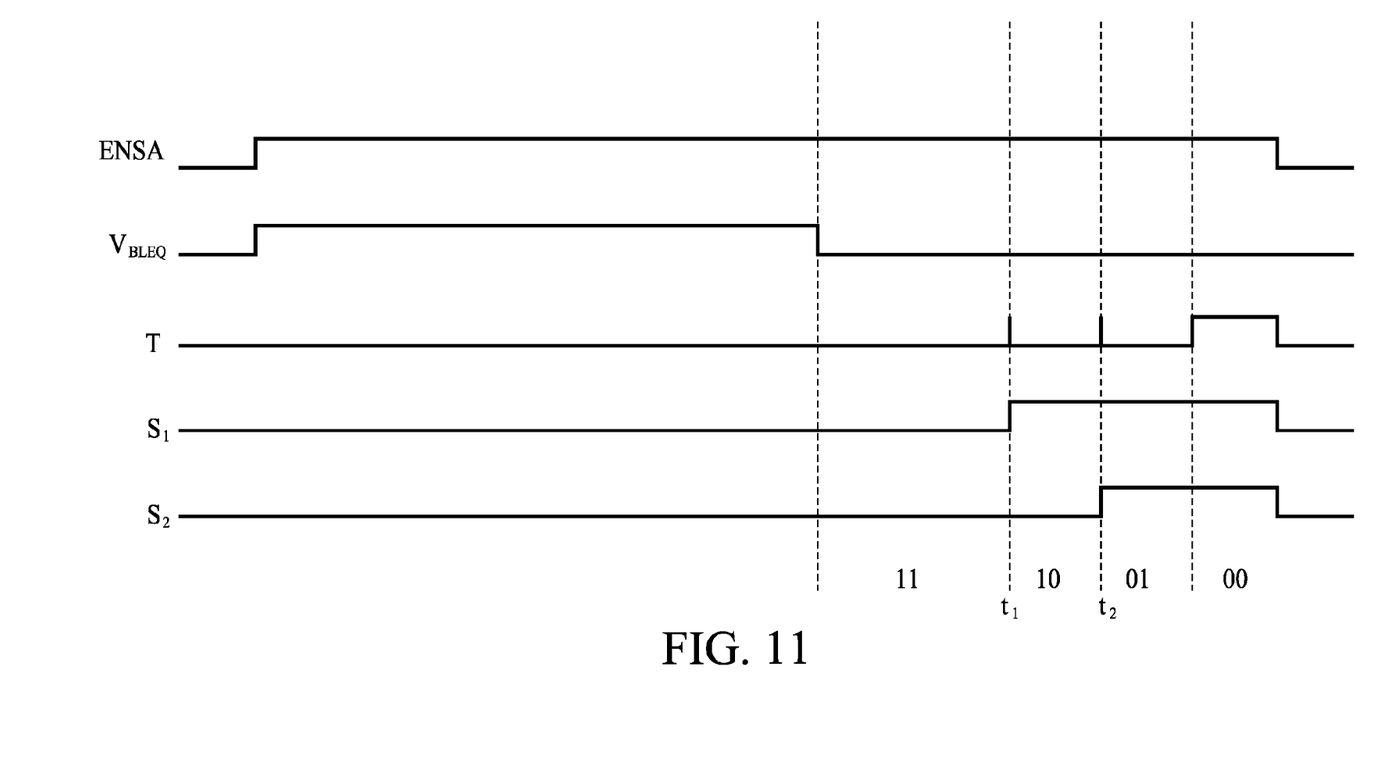
FIG. 11 is a timing diagram of the circuit illustrated in FIG. 10.

FIG. 11 is a timing diagram of the circuit 100 illustrated in FIG. 10. Referring to FIG. 11, the signal T may resemble a glitch as the first switch signal $S_1$ is asserted at time $t_1$ and as the second switch signal is asserted at time $t_2$. In the present embodiment according to the present invention, the data latch 1001 outputs "11" if none of T, $S_1$ and $S_2$ is asserted as SA is asserted, and outputs "00" if all of T, $S_1$ and $S_2$ are asserted as SA is asserted. Moreover, the data latch 1001 outputs "10" if only $S_1$ is asserted as SA is asserted, and outputs "01" if only T is not asserted as SA is asserted.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for sensing a multi-level cell (MLC) flash memory, the circuit comprising:
   a plurality of first decoding units each providing a timing information and including:
      a controlled transistor to allow a current to pass therethrough;
      a capacitor to be charged by the current or to discharge through the controlled transistor;
      a first current-capacitor circuit including:
         a first controlled transistor to allow a first current to flow therethrough; and
         a first capacitor to be charged by the first current; and
      a second current-capacitor circuit including:
         a second controlled transistor to allow a second current to flow therethrough; and
         a second capacitor to be charged by the second current;
   a second decoding unit providing a latch signal and including:
      a controlled transistor to allow a current to pass therethrough, the magnitude of the current being associated with data in an MLC; and
      a capacitor to be charged by the current or to discharge through the controlled transistor; and
   a data latch, in response to the timing information from each of the first decoding units and the latch signal from the second decoding unit, to determine the data in the MLC.

2. The circuit of claim 1, wherein the magnitude of the first current is different from that of the second current, and the capacitance of the first capacitor is equivalent to that of the second capacitor.

3. The circuit of claim 1, wherein the first current-capacitor circuit includes a current minor to allow a mirrored current of the first current to charge the first capacitor.

4. The circuit of claim 1, wherein the first current-capacitor circuit includes a comparator including a non-inverting input coupled to one end of the first capacitor, an inverting input to receive a reference voltage level, and an output coupled to the data latch.

5. The circuit of claim 4, wherein the first current-capacitor circuit includes a transistor including a drain coupled to the one end of the first capacitor and a source coupled to ground, and providing a discharging path for the first capacitor.

6. The circuit of claim 4, wherein the second controlled transistor includes a gate coupled to an output of a first latch, a drain coupled to the one end of the first capacitor and a source coupled to one end of the second capacitor.

7. The circuit of claim 6 further comprising a third current-capacitor circuit including a third controlled transistor to allow a third current to flow therethrough and a third capacitor to be charged by the third current.

8. The circuit of claim 7, wherein the third controlled transistor includes a gate coupled to an output of a second latch, a drain coupled to the one end of the first capacitor and a source coupled to one end of the third capacitor, and wherein the output of the first latch is coupled to an input of the second latch.

9. The circuit of claim 1, wherein the data latch outputs data of N-bit, and the number of the first decoding units is $2^N-1$, where N is a natural number.

10. A circuit for sensing a multi-level cell (MLC) flash memory, the circuit comprising:
   a plurality of first decoding units each providing a timing information and including:
      a controlled transistor to allow a current to pass therethrough;
      a capacitor to be charged by the current or to discharge through the controlled transistor;
      a first current-capacitor circuit including:
         a first controlled transistor to allow a first current to flow therethrough; and
         a first capacitor to discharge through the first controlled transistor; and
      a second current-capacitor circuit including:
         a second controlled transistor to allow a second current to flow therethrough; and
         a second capacitor to discharge through the second controlled transistor;

a second decoding unit providing a latch signal and including:
- a controlled transistor to allow a current to pass therethrough, the magnitude of the current being associated with data in an MLC; and
- a capacitor to be charged by the current or to discharge through the controlled transistor; and a data latch, in response to the timing information from each of the first decoding units and the latch signal from the second decoding unit, to determine the data in the MLC.

11. The circuit of claim 10, wherein the magnitude of the first current is different from that of the second current, and the capacitance of the first capacitor is equivalent to that of the second capacitor.

12. The circuit of claim 10, wherein the first current-capacitor circuit includes a comparator including an inverting input coupled to one end of the first capacitor, a non-inverting input to receive a reference voltage level, and an output coupled to the data latch.

13. The circuit of claim 12, wherein the first current-capacitor circuit includes a transistor including a drain coupled to the one end of the first capacitor and a source coupled to a voltage source, and providing a charging path for the first capacitor.

14. The circuit of claim 12, wherein the second controlled transistor includes a gate coupled to an output of a first latch, a drain coupled to the one end of the first capacitor and a source coupled to one end of the second capacitor.

15. The circuit of claim 14, further comprising a third current-capacitor circuit including a third controlled transistor to allow a third current to flow therethrough and a third capacitor to discharge through the third controlled transistor.

16. The circuit of claim 15, wherein the third controlled transistor includes a gate coupled to an output of a second latch, a drain coupled to the one end of the first capacitor and a source coupled to one end of the third capacitor, and wherein the output of the first latch is coupled to an input of the second latch.

17. The circuit of claim 1, wherein the timing information is based on a charging time associated with the current and the capacitor, and wherein each of the first decoding units has a different charging time.

18. A circuit for sensing a multi-level cell (MLC) flash memory, the circuit comprising:
- a first current-capacitor circuit including a first controlled transistor to allow a first current to flow therethrough and a first capacitor to be charged by the first current, and providing a first timing information based on a first charging time associated with the first current and the first capacitor; and
- a second current-capacitor circuit including a second controlled transistor to allow a second current to flow therethrough and a second capacitor to be charged by the second current, and providing a second timing information based on a second charging time associated with the second current and the second capacitor, wherein the first charging time is different from the second charging time.

* * * * *